United States Patent

Tuft

[15] 3,643,136

[45] Feb. 15, 1972

[54] GLASS PASSIVATED DOUBLE BEVELED SEMICONDUCTOR DEVICE WITH PARTIALLY SPACED PREFORM

[72] Inventor: Bernard R. Tuft, Scipio Center, N.Y.

[73] Assignee: General Electric Company

[22] Filed: May 22, 1970

[21] Appl. No.: 39,937

[52] U.S. Cl.......................317/234 R, 317/234 E, 317/234 F, 317/234 G, 317/235 AB, 317/235 AG, 317/235 AJ

[51] Int. Cl. ..........................................................H01l 1/08

[58] Field of Search..........317/234 E, 234 F, 234 G, 235 AB, 317/235 AJ

[56] References Cited

UNITED STATES PATENTS

| | | | |
|---|---|---|---|
| 3,320,495 | 5/1967 | Fox et al. | 317/234 |
| 3,303,068 | 2/1967 | Scott | 148/177 |
| 3,361,943 | 1/1968 | Knott et al. | 317/235 |
| 3,343,048 | 9/1967 | Kuehn et al | 317/234 |
| 3,337,781 | 8/1967 | Ferree | 317/234 |
| 3,441,422 | 4/1969 | Graff | 317/234 X |

OTHER PUBLICATIONS

Michelitsch, "Semiconductor Housing," IBM Tech. Discl. Bull. Vol. 6, No. 6, November 1963, p. 71

*Primary Examiner*—John W. Huckert
*Assistant Examiner*—William D. Larkins
*Attorney*—Robert J. Mooney, Nathan J. Cornfeld, Carl O. Thomas, Frank L. Neuhauser, Oscar B. Waddell and Joseph B. Forman

[57] ABSTRACT

A silicon semiconductive element is provided with first and second spaced contact surfaces. A beveled peripheral edge extends from the first contact surface and intersects a first junction, and a second peripheral edge extends from the second contact surface to the beveled edge and intersects a second junction. A ceramic preform surrounds the semiconductive element with a surface conforming to one of the peripheral edges of the element. The preform has a thermal coefficient of expansion substantially matching that of the silicon thyristor element. A glass passivant bonds the one peripheral edge of the element to the conforming surface of the preform. The glass passivant also overlies a remaining of the peripheral edges and is spaced from the preform adjacent this edge. The glass passivant has a thermal coefficient of expansion in excess of that of silicon and below $45 \times 10^{-7}$/°C., a firing temperature below that of the preform, and a maximum thickness less than 1 mil. Contacts are associated with the first and second contact surfaces and are sealingly associated with the preform.

25 Claims, 2 Drawing Figures

PATENTED FEB 15 1972 3,643,136

Figure 1:
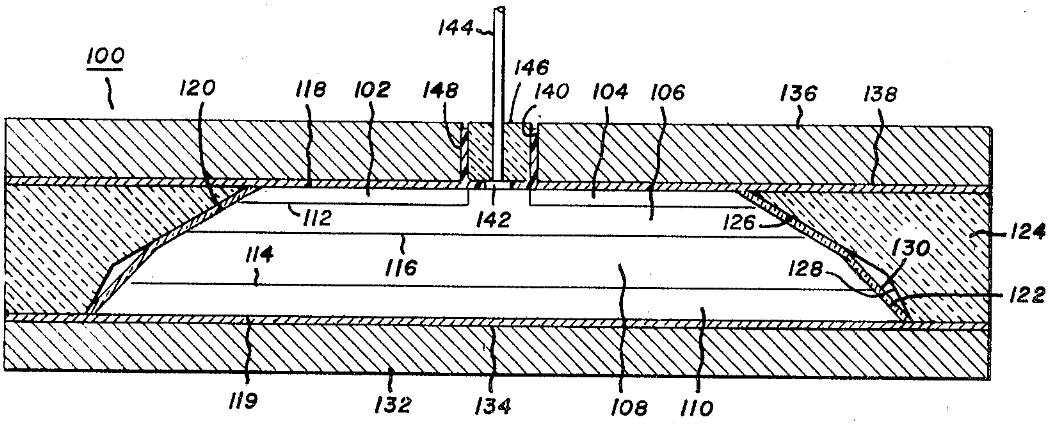

INVENTOR:
BERNARD R. TUFT,

BY Carl O. Thomas
HIS ATTORNEY.

GLASS PASSIVATED DOUBLE BEVELED SEMICONDUCTOR DEVICE WITH PARTIALLY SPACED PREFORM

My invention relates to a novel package for a silicon semiconductive element which is particularly well suited for power level semiconductor devices having multiple peripheral edges.

Silicon semiconductor rectifiers are known to the art which utilize glass both as the junction passivant and as the entire insulative hermetic housing for the silicon semiconductive element. A typical example is the A14 rectifier sold by the General Electric Company. While the hermetic encapsulation approach is highly successful for relatively low current, small diameter silicon semiconductive element devices, the differences in the thermal coefficients of expansion of the silicon and glass passivant preclude this approach from being applied to the manufacture of devices where the silicon semiconductive element approaches 150 mils in width, since larger elements produce much larger stresses in the glass.

A very intense investigation has been conducted in the art for a glass which is both suitable for use as a junction passivant and which exhibits a thermal coefficient of expansion sufficiently matched to that of silicon to allow it to be successfully applied to larger diameter silicon elements as the sole sealing and encapsulating material. While a number of glasses have been identified which have a thermal coefficient of expansion which sufficiently matches that of silicon, these glasses have proven generally unsuitable for direct bonding to silicon surfaces either because of extremely high fusion temperatures, typically above 900° C., or because of degradation of the electronic properties of the silicon semiconductive elements at their junctions—i.e., lack of suitable passivation characteristics.

Lacking a glass passivant that is capable of also forming a hermetic package for power level silicon semiconductive elements, the art has heretofore resorted to the use of thin layers of glass passivant bonded to the edges of silicon semiconductive elements to be passivated. These thin layer passivants because of their fragility and their resultant questionable ability to alone exclude all contaminants from the semiconductive element have been used in conjunction with other supplementary passivant and housing materials. For example, Felock in copending, commonly assigned application Ser. No. 782,083, filed Dec. 9, 1968, now Pat. No. 3,559,002 discloses a power level semiconductor device in which a thin glass passivant layer is supplemented by a silicone passivant with a molded housing surrounding the silicone passivant. In another approach a thin glass passivant layer may be placed on the edge of a power level silicon semiconductive element and the element mounted within a hermetically sealed housing.

Davies in commonly assigned patent application Ser. No. 39,936, filed on even date with this application discloses a novel packaging solution for semiconductor devices in which a glass passivant is utilized both to passivate the peripheral edge of the semiconductive element and to bond a ceramic preform having a thermal coefficient of expansion substantially matching that of silicon to the peripheral edge. The difficulty of glass fracture as a result of the differences in the thermal coefficients of expansion of the glass and silicon are offset by the stabilizing influence of the preform and by limiting the thickness of the glass to less than 1 mil. At the same time the preform-passivant composite offers generally the same advantages in protection that is afforded by thick glass passivant layers in low current devices, with the notable advantage that Davies' approach may be also applied to power level devices.

While Davies' invention represents a significant advance in the art, I have observed that it is somewhat difficult to apply Davies' teachings to a power level semiconductor device of a type having multiple peripheral edges. For example, thyristor semiconductive elements typically have a shallowly beveled peripheral edge that traverses the forward voltage blocking junction and a substantially steeper beveled edge that traverses the principal reverse voltage blocking junction. In order to apply Davies' teachings to such a device it is necessary to configure the preform so that it conforms to the two beveled peripheral surfaces with a spacing of less that 1 mil. While this is possible, it is not compatible with ordinary manufacturing approaches used for beveling. For example, while the more shallowly beveled peripheral edge is formed by lapping at a precisely controlled bevel angle, the width of this peripheral edge will vary significantly from element to element, depending on the duration of lapping and other process variables. Also, the more steeply beveled edge is typically very imprecisely formed by techniques such as grit blasting. Accordingly, to attempt to apply Davies' teaching to semiconductive elements having plural peripheral edges formed by ordinary manufacturing techniques would require the custom fitting of each preform to each element.

It is an object of my invention to provide a novel package arrangement whereby a composite insulator may be utilized both as a junction passivant and as the sole insulative housing for a silicon semiconductive element, particularly where the semiconductive element is provided with plural peripheral edges and junctions.

This and other objects of my invention may be accomplished in one aspect by providing a semiconductor device comprised of a silicon semiconductive element having first and second spaced contact surfaces. A beveled peripheral edge extends from the first contact surface and intersects a first junction, and a second peripheral edge extends from the second contact surface to the beveled edge and intersects a second junction. A ceramic preform surrounds the semiconductive element and has a surface conforming to one of the peripheral edges of the element and spaced therefrom less than 1 mil. The preform has a thermal coefficient of expansion substantially matching that of the silicon thyristor element. A glass passivant bonds the one peripheral edge of the element to the conforming surface of the preform. The glass passivant also overlies a remaining of the peripheral edges and is spaced from the preform adjacent the remaining peripheral edge. The glass passivant has a thermal coefficient of expansion in excess of that of silicon and below $45\times10^{-7}/°$ C., a firing temperature below that of the preform, and a maximum thickness less that 1 mil. Contact means are associated with the first and second contact surfaces and are sealingly associated with the preform.

Figure 2:
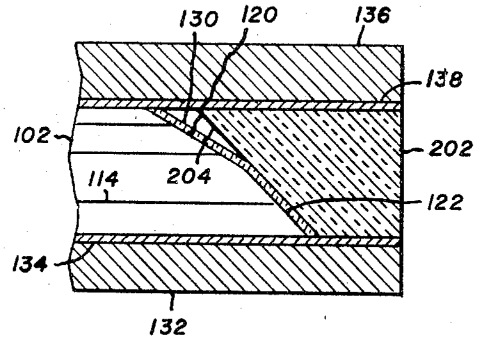

My invention may be better understood by reference to the following detailed description considered in conjunction with the drawings, in which FIG. 1 is a vertical section of a thyristor formed according to my invention; and FIG. 2 is a fragmentary sectional view of a modified form of my invention.

In both figures the thickness of the semiconductive element is exaggerated as compared to its width and sectioning is omitted from the semiconductive element in order to improve the clarity of the drawings.

Noting FIG. 1, a thyristor 100 is shown including a silicon thyristor semiconductive element 102, which may be of conventional construction. As shown, the thyristor element includes four sequentially arranged layers 104, 106, 108, and 110. The layers are of alternate conductivity type so that adjacent layers are of opposite conductivity type. Most typically the layers 104 and 108 are of N-type conductivity while the layers 106 and 110 are of P-type conductivity. The endmost layers 104 and 110 are referred to as emitter layers while the intermediate layers 106 and 108 are referred to as base layers. Layers 104 and 106 are separated by an emitter junction 112 while the layers 108 and 110 are separated by an emitter junction 114. A collector junction 116 separates the base layers.

The thyristor semiconductive element is provided with a first contact surface 118 and a second contact surface 119. The emitter layer 104 lies adjacent a major portion of the first contact surface while the base layer 106 forms a central minor portion of this surface. The emitter junction 112 intersects the first contact surface mediate the emitter and base layers. The emitter layer 110 lies adjacent the second contact surface.

A relatively shallowly beveled peripheral edge 120 of the semiconductive element extends downwardly and outwardly from the first contact surface. This peripheral edge intersects the junctions 112 and 116 at an acute angle. Inasmuch as the layers 104, 106, and 108 exhibit resistivities increasing in that order, the beveled edge 120 forms a negative bevel angle with respect to these junctions. Typically surface field gradients associated with negatively beveled junctions are reduced where the angle of beveling is less than 20°. A comparatively steeply beveled edge 122 extends from the second contact surface to the shallowly beveled peripheral edge 120. Since the layer 108 is of a higher resistivity than the layer 110, the peripheral edge 122 intersects the emitter junction 114 to form a positive bevel angle. As is well understood in the art a positive bevel angle spreads the surface field gradient with a continuous improvement being observable as the bevel angle decreases from 90° and approaches 0. Accordingly, it is not essential or in most cases desirable that the peripheral edge 122 be beveled as shallowly as the peripheral edge 120. In fact, for many applications the peripheral edge may even be normal to the contact surfaces; that is, it may intersect the junction 114 at a right angle. Typically the peripheral surface 120 is ground to a precise angle to optimize the characteristics of the collector junction. In most instances a negative bevel angle in the range of from 3° to 8° is chosen for the peripheral edge 120. By contrast the peripheral edge 122 is typically formed at an angle in the range of 20° to 45° by a technique such as grit blasting. While grit blasting is a convenient manufacturing technique for forming this surface, it does not assure uniformity of the peripheral edge 122. Thus, peripheral edge 120 is typically uniformly ground and precisely controlled as to bevel angle, although this edge may vary considerably in width. The peripheral edge 122 may vary in slope, width, and evenness. It is considered unnecessary to discuss beveled thyristor elements in detail, since these are well known in the art. Exemplary teachings include Davies et al. U.S. Pat. No. 3,491,272, issued Jan. 20, 1970, and Clark et al. U.S. Pat. No. 3,179,860, issued Apr. 20, 1965, the disclosures of which are here incorporated by reference.

A ceramic preform 124 is provided with a surface 126 which is shaped to conform to the beveled peripheral edge 120. The surface 126 is laterally spaced from the junctions 112 and 116 by less than 1 mil and extends laterally past the intersection of the peripheral edges 120 and 122. The preform is provided with a surface 128 that intersects the lateral extension of the surface 126 and is laterally spaced from the peripheral edge 122. The surface 128 is normally spaced more than 1 mil (0.001 inch) from the peripheral edge 122 to leave a gap therebetween. The surface 128 may take any convenient shape and does not conform to the peripheral edge 122. In one form the surface 128 may be a continuation of the surface 126.

The ceramic preform must have a thermal coefficient of expansion which substantially matches that of silicon—i.e., in the range of from 30 to $37\times10^{-7}/°$ C. While a substantial match of the preform to silicon in the range indicated is necessary to the practice of my invention, it is not essential or practical to attempt an exact match of the preform to the silicon, since it is recognized that monocrystalline silicon exhibits differing coefficients of thermal expansion in differing crystallographic planes. Since the preform will for many device configurations extend between device anode and cathode terminals (or emitter and collector terminals), it is preferred that the preform exhibit a dielectric strength of at least 100 volts/mil and a resistivity of at least $10^{10}$ ohm-cm. Either crystalline or vitreous ceramics may be used. Also, combinations of ceramics may be used. For example, a glazed ceramic preform may be utilized. It is preferred to utilize vitreous ceramics—that is, glass—since they can be formed entirely pore free. It is recognized, however, that fluid pervious ceramic preforms may be utilized. Suitable ceramics for use in forming preforms are known and available, such as borosilicate and aluminosilicate glasses. Examples of commercially available borosilicate glasses include Corning Glass No. 7720, No, 7740, and No. 7770. Because of its low alkali content Corning Glass No. 7723 is a particularly preferred borosilicate glass. Exemplary aluminosilicate glasses include Corning Glass No. 1710 and No. 1720. To illustrate typical glass compositions Corning Glass No. 7720 consists of on a weight percent basis 73.0% $SiO_2$, 16.5% $B_2O_3$, 4.5% $K_20$ and $Na_2O$, 6.0% PbO, and the remainder trace ingredients while Corning Glass No. 7740 consists of 80.5% $SiO_2$, 12.9% $B_2O_3$, 3.8% $Na_2O$, 0.4% $K_2O$, 2.2% $Al_2O_3$, and the remainder trace ingredients.

A glass passivant 130 is interposed between and bonded to the peripheral edges of the semiconductive element and to the surface 126. The glass passivant exhibits a maximum thickness normal to the peripheral edges of less than 1 mil. It is tenaciously bonded to both the preform and the semiconductive element. Since the preform surface must be conformed to the edge 120 of the silicon semiconductive element with some accuracy, it is essential that the glass passivant be chosen of a composition that can be bonded below the firing temperature—that is, the softening temperature—of the ceramic preform. This presents little difficulty, since glass passivants typically soften well below 700° C. while ceramic preforms of the compositions set forth above typically exhibit a firing or softening temperature in excess of 900° C. A more rigorous requirement of the glass passivant is that it exhibit a thermal coefficient of expansion of less than $45\times10^{-7}/°$ C. Exemplary glass passivants meeting the above criteria are disclosed by Graff in U.S. Pat. No. 3,441,442, issued Apr. 29, 1969, and by Martin in U.S. Pat. No. 3,113,898, issued Dec. 10, 1963, the disclosures of which are here incorporated by reference. Uniting the semiconductive element and ceramic preform can be accomplished merely by placing a finely divided glass frit formed of the glass passivant on the peripheral edges of the semiconductive element and heating to the bonding temperature of the glass passivant. Preferably the glass passivant should be fired to its annealing temperature, although sufficient bonding may be obtained merely by heating the glass passivant to its softening temperature.

A refractory metal backup plate 132 is ohmically conductively associated with emitter layer 110 by bonding material 134. The bonding material also sealingly bonds the backup plate to the ceramic preform. The refractory metal backup plate is chosen to exhibit a thermal coefficient of expansion of $55\times10^{-7}/°$ C. or less. Typically the backup plates are formed of tungsten or molybdenum. The low thermal coefficient of expansion limits the thermal stresses that are applied by the backup plate to the semiconductive element. The bonding material includes either a hard or a soft solder and may be comprised of one or a plurality of layers of like or differing composition, as is well understood in the art. Typically the silicon semiconductive element and ceramic preform are first provided with one or more contact layers to facilitate soldering to these surfaces. An annular backup plate 136 which may be formed of a refractory metal having a thermal coefficient of expansion of $55\times10^{-7}/°$ C. or less similarly as backup plate 132 overlies the first contact surface externally of the junction 112 and extends laterally outwardly over the ceramic preform. Bonding material 138 which may be identical to bonding material 134 is provided to ohmically conductively associate the backup plate with the emitter layer 104 and to sealingly associate the backup plate with the ceramic preform.

The annular backup plate includes a central opening 140 to permit gate access to the semiconductive element. Gate metallization 142 is associated with the first contact surface centrally of the emitter junction 112. A gate lead 144 is conductively associated with the gate metallization. In a preferred form a dielectric material is positioned in the central opening which both passivates the junction 112 at its intersection with first contact surface and seals between the backup plate and gate lead. However, this is not essential, since the junction 112 is not usually relied upon to block current flow through the thyristor. Normally whatever current blocking function the junction 112 might perform can be performed more efficiently by the junction 114. Since a high level of protection for the junction 112 is not required, a protective material such as silicone resin or varnish, fluorocarbon resin, etc., may be utilized. While these materials bond well and function reasonably well as junction passivants, they are to some extent penetrable by contaminants. Instead of using these types of materials it is also possible to utilize a glass which has a thermal coefficient of expansion substantially matching that of the silicon semiconductive element. For example, one of the Corning glasses above noted may be utilized. While such glasses will provide an impenetrable seal and will not fracture upon operation of the device, they may have an immediate downgrading effect on the junction 112 which may, however, be acceptable where blocking characteristics are not important for this junction.

In the preferred form shown a ceramic preform 146 is bonded to the gate lead. The gate lead may be soldered to the preform, for example. The exterior surface of the preform conforms to the first contact surface and the inner edge of the annular backup plate with a spacing of less than 1 mil therebetween. A glass passivant 148 bonds the preform to the backup plate and the silicon semiconductive element. The glass passivant also overlies the junction 112 at its intersections with the contact surface. The glass passivant and ceramic preform are preferably chosen applying the criteria discussed above in connection with the ceramic preform and glass passivant 130.

While I have disclosed by invention with reference to a specific thyristor application, it is appreciated that it may be readily applied to other applications. For example, my invention may be applied to multiple junction silicon semiconductive elements generally where multiple peripheral edges are provided. In FIG. 1 if the junction 112 were formed in a single plane like the remaining junctions and the gate lead omitted, the device could be switched by avalanche in the manner of a Shockley diode. In this instance, of course, the backup plate 136 would normally not include the opening 140. If in FIG. 1 the junction 116 were omitted, so that the semiconductive element contained only a single base region, the resulting device would be a transistor. The semiconductive element 102 may be circular in cross section with the peripheral edges being annular. Alternately, the semiconductive element may be square, rectangular, hexagonal, or of any other convenient polygonal configuration. In such instance the peripheral edges will be polyhedral. It is accordingly apparent that my invention is not dependent on any particular semiconductive element cross-sectional configuration.

A modified application of my invention is shown in FIG. 2 in which like elements are assigned like reference numerals and are not redescribed in detail. The ceramic preform 202 differs from the ceramic preform 124 in that it is provided with a single interior surface 204 intended to conform to surface 122 of the semiconductive element. The interior surface 204 is relatively widely spaced from element surface 120. While the spacing between surfaces 204 and 122 is less than 1 mil. The glass passivant overlies all peripheral junction intersections and bonds to the preform adjacent element surface 122. This arrangement requires that the surface 122 be formed with some degree of precision, as by lapping. This arrangement is particularly advantageous where a high level of protection and stabilization is desired for the reverse blocking junction 114. In FIG. 1 if an imperfection is present in the glass passivant adjacent the junction 114, a possibility exists of a corona developing in the space between the passivant and preform. In the arrangement of FIG. 2 no such spacing exists adjacent the junction 114, although a similar spacing exists adjacent junctions 112 and 116. Whether the device configuration of FIG. 1 or that of FIG. 2 is utilized in a specific application may depend on such factors as the manner in which the surface 122 is formed, whether it is desired to impart the highest statistical reliability to junction 114 or junction 116, the cost advantage of the preform 202 as compared to the preform 124, etc.

Still other variations will readily occur to those skilled in the art. Accordingly, it is intended that the scope of my invention be determined by reference to the following claims.

What I claim and desire to secure by Letters Patent of the United States is:

1. A semiconductor device comprising a waferlike silicon semiconductive element having first and second substantially parallel spaced contact surfaces, a beveled peripheral edge extending from said first contact surface at an acute angle relative to said first contact surface and intersecting a first junction and a second peripheral edge extending from said second contact surface to said beveled edge and intersecting a second junction, a ceramic preform surrounding said semiconductive element and having a first internal surface conforming to one of said peripheral edges of said element and spaced therefrom less than 1 mil, said preform having a second internal surface disposed opposite the other of said peripheral edges and relieved to have a spacing from said other peripheral edge substantially greater than 1 mil, the thermal coefficient of expansion of said preform substantially matching that of said silicon semiconductive element, a layer of glass passivant bonding one of said peripheral edges of said element to said conforming surface of said preform, said glass passivant also overlying the other of said peripheral edges and being spaced from said preform adjacent said other peripheral edge, said glass passivant having a thermal coefficient of expansion in excess of that of silicon and below $45\times10^{-7}/°$ C., a firing temperature below that of said preform, and a maximum thickness less than 1 mil, and contact means associated with said first and second contact surfaces and sealingly associated with said preform.

2. A semiconductor device according to claim 1 in which said peripheral edges are annular and said silicon semiconductive element exhibits a diameter in excess of 150 mils.

3. A semiconductor device according to claim 1 in which said peripheral edges are polyhedral and said silicon semiconductive element exhibits a width along one of said contact surfaces in excess of 150 mils.

4. A semiconductor device according to claim 1 in which said second peripheral edge of said semiconductive element is positively beveled.

5. A semiconductor device according to claim 1 in which said beveled peripheral edge of said semiconductive element is negatively beveled in an amount sufficient to reduce the surface field gradient of said first junction adjacent said edge.

6. A semiconductor device according to claim 1 in which said beveled peripheral edge is negatively beveled adjacent said first junction and said second peripheral edge is positively beveled adjacent said second junction.

7. A semiconductor device according to claim 1 in which said preform is comprised of glass.

8. A semiconductor device according to claim 1 in which said preform is formed entirely of glass.

9. A semiconductor device according to claim 1 in which said glass passivant is a zinc borosilicate glass.

10. A semiconductor device according to claim 1 in which said contact means include a refractory metal backup plate having a thermal coefficient of expansion of less than $55\times10^{-7}/°$ C.

11. A semiconductor device according to claim 1 in which said one peripheral edge is said beveled peripheral edge.

12. A semiconductor device according to claim 1 in which said one peripheral edge is said second peripheral edge.

13. A thyristor comprising a silicon thyristor element having four sequentially arranged layers with adjacent layers being of opposite conductivity type, said layers forming three junctions therebetween, a first endmost of said layers lying adjacent a first contact surface and a remaining endmost of said layers lying adjacent a second contact surface, a beveled peripheral edge extending from said first contact surface and intersecting one of said junctions and a second peripheral edge extending from said second contact surface to said beveled edge and intersecting a second junction, and a package for encasing said thyristor element comprising a ceramic preform surrounding said thyristor element and having a first internal surface conforming to one of said peripheral edges of said element and spaced therefrom less than 1 mil, said preform having a thermal coefficient of expansion substantially matching that of said silicon thyristor element, a glass passivant bonding said one peripheral edge of said element to said conforming surface of said preform, said glass passivant also overlying a remaining of said peripheral edges and spaced from said preform adjacent said remaining peripheral edge, said glass passivant having a thermal coefficient of expansion in excess of that of silicon and below $45\times10^{-7}/°$ C., a firing temperature below that of said preform, and a maximum thickness less than 1 mil, and contact means associated with said first and second contact surfaces and sealingly associated with said preform.

14. A thyristor according to claim 13 in which said contact means include first main current carrying contact means bonded to a major portion of said first endmost layer adjacent said first contact and to said preform, gate contact means bonded to an intermediate layer of said thyristor element at said first contact surface at a location separated from said first main current carrying contact means by a junction, second main current carrying contact means bonded to said second contact surface and to said preform at a location spaced from said first contact means, and insulative means interposed between said gate contact means and said first main current carrying contact means.

15. A thyristor according to claim 13 in which said peripheral edges are annular and said silicon semiconductive element exhibits a diameter in excess of 150 mils.

16. A thyristor according to claim 13 in which said peripheral edges are polyhedral and said silicon semiconductive element exhibits a width alone one of said contact surfaces in excess of 150 mils.

17. A thyristor according to claim 13 in which said second peripheral edge of said thyristor element is positively beveled.

18. A thyristor according to claim 13 in which said beveled peripheral edge of said thyristor element is negatively beveled in an amount sufficient to reduce the surface field gradient of said first junction adjacent said edge.

19. A thyristor according to claim 13 in which said beveled peripheral edge is negatively beveled adjacent said first junction and said second peripheral edge is positively beveled adjacent said second junction.

20. A thyristor according to claim 13 in which said preform is comprised of glass.

21. A thyristor according to claim 13 in which said preform is formed entirely of glass.

22. A thyristor according to claim 13 in which said glass passivant is a zinc borosilicate glass.

23. A thyristor according to claim 13 in which said contact means include a refractory metal backup plate having a thermal coefficient of expansion of less than $55\times10^{-7}/°$ C.

24. A thyristor according to claim 13 in which said one peripheral edge is said beveled peripheral edge.

25. A thyristor according to claim 1 in which said one peripheral edge is said second peripheral edge.

* * * * *